(12) United States Patent
Yu et al.

(10) Patent No.: US 11,735,476 B2
(45) Date of Patent: Aug. 22, 2023

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Hailong Yu, Shanghai (CN); Jingjing Tan, Shanghai (CN); Xuezhen Jing, Shanghai (CN); Wen Guo, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 126 days.

(21) Appl. No.: 17/021,377

(22) Filed: Sep. 15, 2020

(65) Prior Publication Data

US 2021/0090949 A1     Mar. 25, 2021

(30) Foreign Application Priority Data

Sep. 19, 2019   (CN) .......................... 201910887415.8

(51) Int. Cl.
| | |
|---|---|
| *H01L 21/768* | (2006.01) |
| *H01L 23/522* | (2006.01) |
| *H01L 23/532* | (2006.01) |

(52) U.S. Cl.
CPC .. *H01L 21/76879* (2013.01); *H01L 21/76814* (2013.01); *H01L 21/76843* (2013.01); *H01L 23/5226* (2013.01); *H01L 23/53252* (2013.01); *H01L 23/53266* (2013.01)

(58) Field of Classification Search
CPC ......... H01L 2924/00; H01L 2924/0002; H01L 2924/00014; H01L 2224/0401; H01L 2924/014
See application file for complete search history.

(56) References Cited

U.S. PATENT DOCUMENTS

| | | | |
|---|---|---|---|
| 10,381,263 B1 * | 8/2019 | Yang ................. | H01L 21/32137 |
| 2015/0102461 A1 * | 4/2015 | Lee ................... | H01L 27/10814 |
| | | | 257/532 |
| 2015/0279856 A1 * | 10/2015 | Hyun ................ | H01L 27/11551 |
| | | | 257/329 |
| 2016/0093538 A1 * | 3/2016 | Wakatsuki ...... | H01L 21/823871 |
| | | | 438/660 |
| 2020/0385853 A1 * | 12/2020 | Tsukada .............. | C23C 14/3414 |
| 2021/0292886 A1 * | 9/2021 | Nakano ............... | C23C 14/3407 |

* cited by examiner

*Primary Examiner* — Tony Tran
(74) *Attorney, Agent, or Firm* — Anova Law Group, PLLC (57) ABSTRACT

A semiconductor structure and its fabrication method are provided. The method includes: providing a substrate and a first metal layer in the substrate; forming a dielectric layer with a first opening exposing a portion of a top surface of the first metal layer on the substrate; bombarding the portion of the top surface of the first metal layer exposed by the first opening, by using a first sputtering treatment, to make metal materials on the top surface of the first metal layer be sputtered onto sidewalls of the first opening to form a first adhesion layer; and forming a second metal layer on a surface of the first adhesion layer and on the exposed portion of the top surface of the first metal layer using a first metal selective growth process.

17 Claims, 8 Drawing Sheets

SEMICONDUCTOR STRUCTURE AND FABRICATION METHOD THEREOF

CROSS-REFERENCE TO RELATED APPLICATION

This application claims the priority of Chinese Patent Application No. 201910887415.8, filed on Sep. 19, 2019, the content of which is incorporated herein by reference in its entirety.

TECHNICAL FIELD

The present disclosure generally relates to the field of semiconductor manufacturing technologies and, more particularly, relates to a semiconductor structure and its fabrication method.

BACKGROUND

As semiconductor technologies develop continuously, feature sizes of semiconductor devices decrease continuously. Decrease of the feature size means that more transistors can be deployed in a single chip, and induces a higher demand on semiconductor processes. As the feature sizes of the semiconductor devices further decrease, contact resistance of a metal-oxide-semiconductor (MOS) transistor may have more effect on device performance of the MOS transistor and even the whole semiconductor chip. To improve the device performance of the semiconductor chip, the contact resistance of the MOS transistor has to be reduced.

Currently, conductive plugs are often formed by a selective growth process of tungsten, which can effectively increase the conductive plug's volume. Correspondingly, the contact area at the bottom of the conductive plug can be increased and the contact resistance can be reduced.

However, the device performance of the conductive plug formed by existing process still needs to be improved.

SUMMARY

The present disclosure provides a semiconductor structure and its fabrication method to at least partially alleviate the above problems. In the present disclosure, a first adhesion layer may be formed. Correspondingly, an adhesive performance between a first opening and a first metal layer may be improved, and metal contamination induced by external impurities entering the first opening may be alleviated.

One aspect of the present disclosure provides a fabrication method for forming a semiconductor structure. The method includes: providing a substrate and a first metal layer in the substrate; forming a dielectric layer with a first opening exposing a portion of a top surface of the first metal layer on the substrate; bombarding the portion of the top surface of the first metal layer exposed by a bottom of the first opening, by using a first sputtering treatment, to make metal materials on the top surface of the first metal layer be sputtered onto sidewalls of the first opening to form a first adhesion layer; and using a first metal selective growth process to form a second metal layer on a surface of the first adhesion layer and on the exposed portion of the top surface of the first metal layer.

Optionally, the substrate includes a base substrate and a device structure in the base substrate; and the first metal layer is located in the device structure.

Optionally, the base substrate is made of a material including silicon, germanium, SiGe, SiC, GaAs, InGa, or a combination thereof.

Optionally, the first metal layer is made of a material including tungsten, cobalt, ruthenium, or a combination thereof.

Optionally, the second metal layer is made of a material including tungsten.

Optionally, the dielectric layer and the first opening are formed by: forming an initial dielectric layer on a surface of the substrate; forming a mask structure on the initial dielectric layer; forming a patterned layer on the mask structure, where the patterned layer includes an opening exposing a portion of the mask structure; etching the exposed portion of the mask structure and the initial dielectric layer by using the patterned layer as a mask, until exposing a top surface of the device structure, to form the dielectric layer and the first opening; and after forming the dielectric layer and the first opening, removing the patterned layer and the mask structure.

Optionally, the initial dielectric layer is made of a material including $SiO_2$, a low-k dielectric material, an ultra-low-k dielectric material, or a combination thereof.

Optionally, the first sputtering treatment uses ions including argon ions, helium ions, or a combination thereof.

Optionally, the first sputtering treatment uses process parameters including a sputtering time of about 5 s to about 10 s and a sputtering power of about 300 W to about 400 W.

Optionally, the second metal layer fills up the first opening.

Optionally, a top surface of the second metal layer is lower than a top surface of the dielectric layer; and the method further includes performing one or more sputtering growth processes to form a conduction structure on a surface of the second metal layer and on a surface of the first adhesion layer, wherein the conduction structure fills up the first opening.

Optionally, each of the one or more sputtering growth processes includes: forming a corresponding portion of a second adhesion layer on the sidewalls of the first opening by using a second sputtering treatment; forming a corresponding portion of a third metal layer in the first opening by a second metal selective growth process.

Optionally, the second sputtering treatment is used to bombard a portion of the surface of the second metal layer exposed by the bottom of the first opening, to make the metal material on the surface of the second metal layer be sputtered onto the sidewalls of the first opening and form the corresponding portion of the second adhesion layer; or the second sputtering treatment is used to bombard a portion of a surface of the third metal layer exposed by the bottom of the first opening, to make the metal material on the surface of the third metal layer be sputtered to the sidewalls of the first opening and form the corresponding portion of the second adhesion layer.

Optionally, the second metal selective growth process is used to form the corresponding portion of the third metal layer on a portion of the surface of the second metal layer exposed by the bottom of the first opening, and on a portion of a surface of the second adhesion layer exposed by the sidewalls of the first opening; or the second metal selective growth process is used to form the corresponding portion of the third metal layer on a portion of a surface of a formed portion of the third metal layer exposed by the bottom of the first opening, and on a portion of the second adhesion layer exposed by the sidewalls of the first opening.

Optionally, the second sputtering treatment uses ions including argon ions, helium ions, or a combination thereof.

Optionally, the second sputtering treatment uses process parameters including a sputtering time of about 5 s to about 10 s and a sputtering power of about 300 W to about 400 W.

Optionally, the third metal layer is made of a material including tungsten.

Another aspect of the present disclosure provides a semiconductor structure. The semiconductor structure includes: a substrate and a first metal layer in the substrate; a dielectric layer on the substrate, where the dielectric layer includes a first opening exposing a portion of a top surface of the first metal layer; a first adhesion layer on sidewalls of the first opening; and a second metal layer on sidewalls of the first adhesion layer and on the exposed portion of the top surface of the first metal layer.

In the present disclosure, the first sputtering treatment may be performed on the surface of the first metal layer. Correspondingly, the material on the surface of the first metal layer may be sputtered onto the surfaces of the sidewalls of the first opening, to form the first adhesion layer. Because of the first sputtering treatment, the sputtered metal material may adhere to the surfaces of the sidewalls of the first opening, and the bonding between the first adhesion layer and the sidewalls of the first opening may be strong. Subsequently, the second metal layer may be formed on the sidewalls of the first adhesion layer and on the top surface of the first metal layer. The bonding between the second metal layer and the sidewalls of the first opening may be improved. The external impurities entering the first opening may be reduced and the metal contamination may be suppressed, to improve the performance of the formed semiconductor structure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
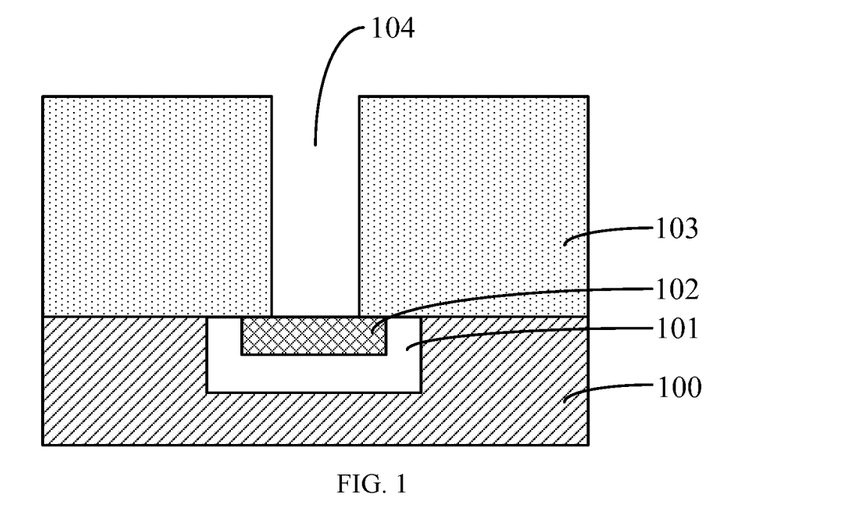
FIGS. 1-2 illustrate structures corresponding to different stages of a method for forming a semiconductor structure.
Figure 2:
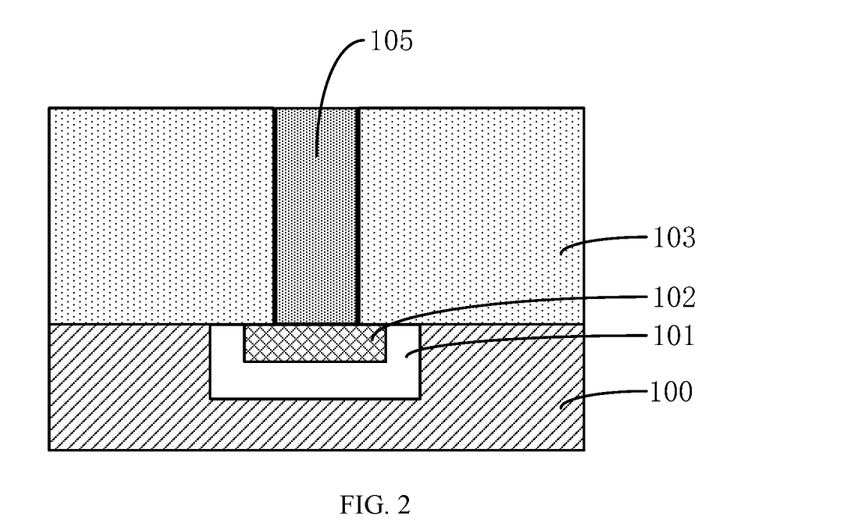

FIGS. 1-2 illustrate structures corresponding to different stages of a method for forming a semiconductor structure.

As illustrated in FIG. 1, a substrate 100 may be provided. A device structure 101 may be deployed in the substrate 100. A first metal layer 102 may be formed in the device structure 101. A dielectric layer 103 may be formed on a top surface of the substrate 100 and on a top surface of the metal layer 102. The dielectric layer 103 may include a first opening 104 exposing the top surface of the metal layer 102.

As illustrated in FIG. 2, a second metal layer 105 may be formed on the top surface of the first metal layer 102 by a metal selective growth process, and the second metal layer 105 may fill up the first opening 104.

The metal selective growth process may use a characteristic that metal tungsten can only be grown on a metal surface. For example, the metal may only be grown on the top surface of the first metal layer 102. Materials on surfaces of sidewalls of the first opening 104 may be a material of the dielectric layer. Correspondingly, although the formed second metal layer 102 may fill up the first opening 104, bonding between the second metal layer 105 and the first opening 104 may be not good, and gaps may be easily formed between the second metal layer 105 and the first opening 104. External impurities may enter the gaps easily, and then may diffuse into the dielectric layer to induce metal contamination. The performance of the formed semiconductor structure may be poor.

The present disclosure provides a semiconductor structure and its fabrication method, to at least partially alleviate the above problem. In the present disclosure, a sputtering treatment may be performed on a surface of a first metal layer. Correspondingly, the material on the surface of the first metal layer may be sputtered onto surfaces of sidewalls of a first opening, to form a first adhesion layer. A second metal layer may be formed on sidewalls of the first adhesion layer and on a top surface of the first metal layer subsequently. Bonding between the second metal layer and the sidewalls of the first opening may be improved, to improve the performance of the formed semiconductor structure.

Reference will now be made in detail to exemplary embodiments of the disclosure, which are illustrated in the accompanying drawings. Wherever possible, the same reference numbers will be used throughout the drawings to refer to the same or like parts.

Figure 11:
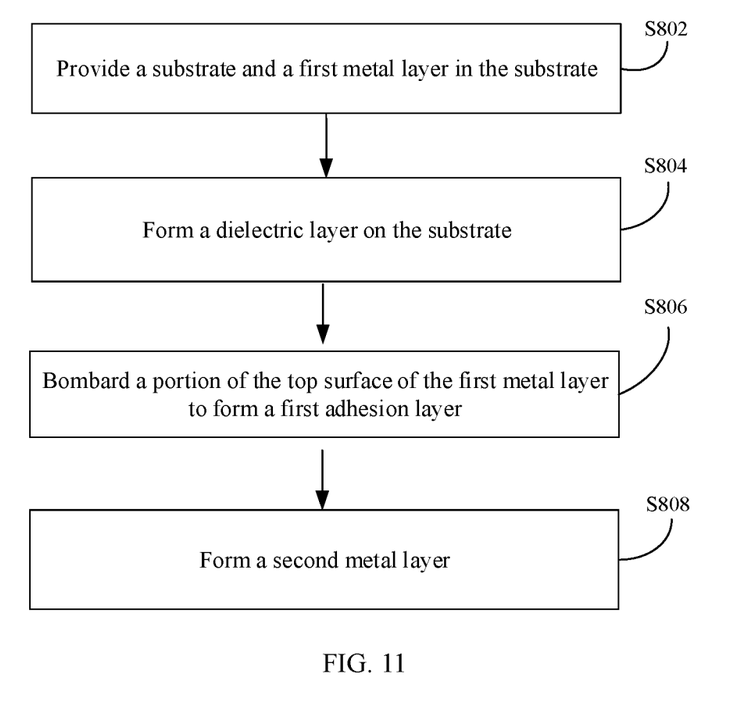
FIG. 11 illustrates an exemplary method for forming a semiconductor structure according to various disclosed embodiments of the present disclosure.

FIGS. 3-6 illustrate semiconductor structures corresponding to different stages of an exemplary method for forming a semiconductor structure consistent with various embodiments of the present disclosure; and FIG. 11 illustrates an exemplary method for forming a semiconductor structure.

Figure 3:
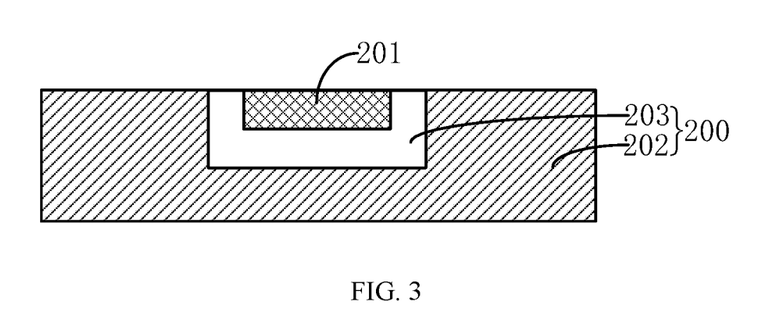
FIGS. 3-6 illustrate structures corresponding to different stages of an exemplary method for forming a semiconductor structure consistent with various embodiments of the present disclosure.

As illustrated in FIG. 3, a substrate 200 may be provided and a first metal layer 201 may be formed in the substrate 200 (e.g., S802 in FIG. 11).

In one embodiment, the substrate 200 may include a base substrate 202 and a device structure 203 in the base substrate 202. The first metal layer 201 may be formed in the device structure 203.

In one embodiment, the base substrate 202 may be made of silicon. In other embodiments, the base substrate 202 may be made of a material including germanium, SiGe, SiC, GaAs, InGa, or a combination thereof.

The device structure 203 may include a gate structure, a resistor structure, a capacitor structure, a memory gate structure, or a combination thereof. In the embodiment illustrated in FIG. 3, the device structure 203 may be a resistor structure.

In one embodiment, the first metal layer 201 may be made of tungsten. In other embodiments, the first metal layer 201 may be made of a material including cobalt or ruthenium.

Figure 4:
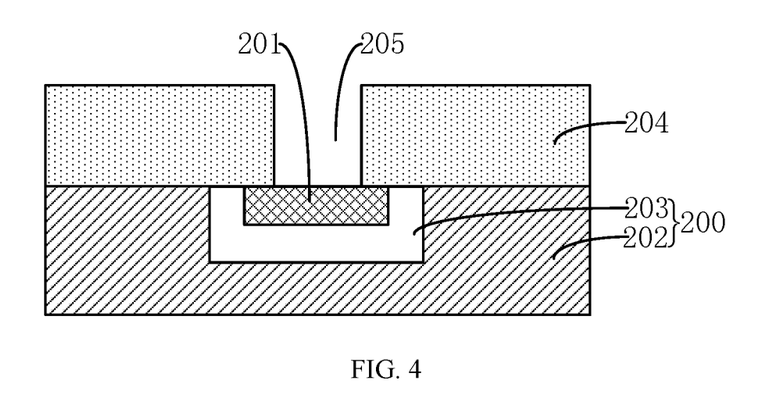

As illustrated in FIG. 4, a dielectric layer 204 may be formed on the substrate 200. The dielectric layer 204 may include a first opening 205 exposing a top surface of the first metal layer 201 (e.g., S804 in FIG. 11).

In one embodiment, a depth of the first opening 205 may be related to a number of sputtering growth processes for forming a conductive structure subsequently. When the depth of the first opening 205 is larger, the number of sputtering growth processes may be larger.

In one embodiment, the dielectric layer 204 and the first opening 205 may be formed by: forming an initial dielectric layer (not illustrated) on the surface of the substrate 200; forming a mask structure (not illustrated) on the initial dielectric layer; forming a patterned layer (not illustrated) on the mask structure where the patterned layer includes an opening exposing a portion of the mask structure; etching the mask structure and the initial dielectric layer by using the patterned layer as a mask, to expose the top surface of the first metal layer 201 and form the first opening 205 and the dielectric layer 204; and after forming the first opening 205 and the dielectric layer 204, removing the patterned layer and the mask structure.

The initial dielectric layer may be made of a material including silicon oxide, a low-k dielectric material (a material with a relative dielectric constant lower than 3.9), or an ultra-low-k dielectric material (a material with a relative dielectric constant lower than 2.5).

In one embodiment, the initial dielectric layer may be made of an ultra-low-k dielectric material (a material with a relative dielectric constant lower than 2.5). The ultra-low-k dielectric material may be SiCOH.

The initial dielectric layer may be formed by an atomic layer deposition process, a chemical vapor deposition process, a physical vapor deposition process, or a sin coating process. In one embodiment, the initial dielectric layer may be formed by the chemical vapor deposition process.

In one embodiment, the mask structure may include a first mask layer on the substrate and a second mask layer on the first mask layer. In other embodiments, the mask structure may be a single-layer mask layer.

In one embodiment, the patterned layer may be formed on the second mask layer. The patter layer may be made of a material including photoresist, and may be formed by a photolithography patterning process.

In one embodiment, the patterned layer may be removed by a wet photoresist removal process or an ashing process. The ashing process may use a gas including oxygen, such as oxygen gas or ozone.

Figure 5:
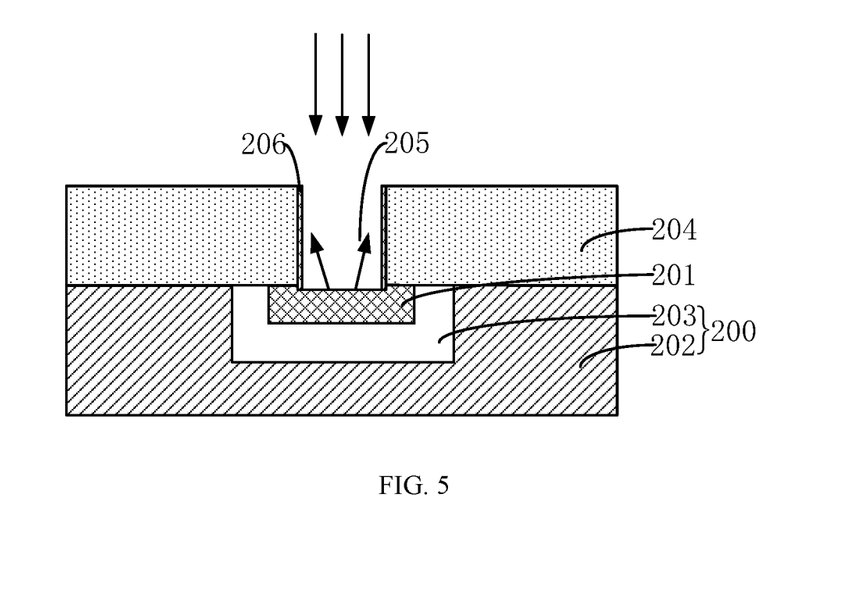

As illustrated in FIG. 5, a first sputtering treatment may be performed to bombard the surface of the first metal layer 201 exposed by a bottom of the first opening 205, such that the metal material on the surface of the first metal layer 201 may be sputtered onto the sidewalls of the first opening 205 to form a first adhesion layer 206 (e.g., S806 in FIG. 11).

In one embodiment, the first sputtering treatment may use ions including argon ions. In some other embodiments, the first sputtering treatment may use ions including helium ions.

Since the argon ions have a large mass, by injecting the argon ions with a high speed to bombard the surface of the first metal layer 201, the kinetic energy of the argon ions may cause the metal material on the surface of the first metal layer 201 to be sputtered outward, and the sputtered metal material may be embedded on the surfaces of the sidewalls of the first opening 205. Correspondingly, bonding between the formed first adhesion layer 206 and the surfaces of the sidewalls of the first opening 205 may be relatively high. Further, the first metal layer 201 may be made of tungsten with stable properties. The first adhesion layer 206 may also be made of tungsten and may not cause metal contamination.

In one embodiment, the first sputtering treatment may use process parameters including a sputtering time of about 5 s to about 10 s, and a sputtering power of about 300 W to about 400 W.

In one embodiment, a thickness of the first adhesion layer 206 perpendicular to the sidewalls of the first opening and a height of the first adhesion layer 206 parallel to the sidewalls of the first opening may depend on the process parameters of the first puttering treatment. When the sputtering time is longer, the thickness of the formed first adhesion layer 206 may be larger. For example, when the sputtering time is about 5 s to about 10 s, the thickness of the formed first adhesion layer 206 may be about 5 Å to about 8 Å. When the sputtering power is large, the height of the first adhesion layer 206 may be larger. For example, when the sputtering power is about 300 W to about 400 W, the height of the first adhesion layer 206 may be about 4 nm to about 5 nm.

Figure 6:
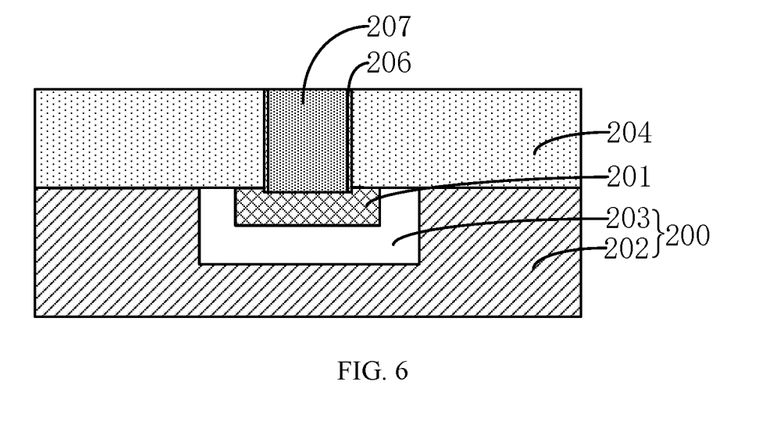

As illustrated in FIG. 6, a second metal layer 207 may be formed on a surface of the first adhesion layer 206 and an exposed portion of the surface of the first metal layer 201, by a first metal selective growth process (e.g., S808 in FIG. 11).

In one embodiment, the second metal layer 207 may be used to connect the device structure 203 with the external environment to form a circuit connection structure and realize the electric functions of the semiconductor structure. In one embodiment, the second metal layer 207 may be made of tungsten.

In one embodiment, the first metal selective growth process may use a precursor material including $WF_6$ and hydrogen gas ($H_2$).

In one embodiment, the first metal selective growth process may use process parameters including a deposition temperature of about 320° C. to 380° C., and a deposition time of about 20 s to about 80 s.

In one embodiment, the first metal selective growth process may use a property that the metal tungsten can grow on a metal surface, to form the second metal layer 207 on the surface of the first adhesion layer 206 and the exposed portion of the surface of the first metal layer 201. Since the second metal layer 207 and the sidewalls of the first opening 205 may be adhered by the first adhesion layer 206, the bonding between the second metal layer 207 and the sidewalls of the first opening 205 may be improved. Correspondingly, the external impurities entering the first opening 205 may be reduced effectively and then the metal contamination may be suppressed. The performance of the semiconductor structure may be improved.

In different embodiments with different process requirements, the depth of the first opening 205 may be different, and the formed second metal layer 207 may or may not fill up the first opening 205. In one embodiment, the second metal layer 207 may fill up the first opening 205.

The present disclosure also provides an exemplary semiconductor structure. As illustrated in FIG. 6, the semiconductor structure may include: a substrate 200, a first metal layer 201 in the substrate 200, a dielectric layer 204 on the substrate 200 with a first opening 205 exposing a portion of a top surface of the first metal layer 201, a first adhesion layer 206 on sidewalls of the first opening 205, and a second metal layer 207 on a surface of the first adhesion layer 206 and an exposed portion of the surface of the first metal layer 201.

The present disclosure also provides another exemplary method for forming a semiconductor structure. FIGS. 7-10 illustrate structures corresponding to different stages of the method, and FIG. 12 illustrates the method for forming the semiconductor structure.

Figure 7:
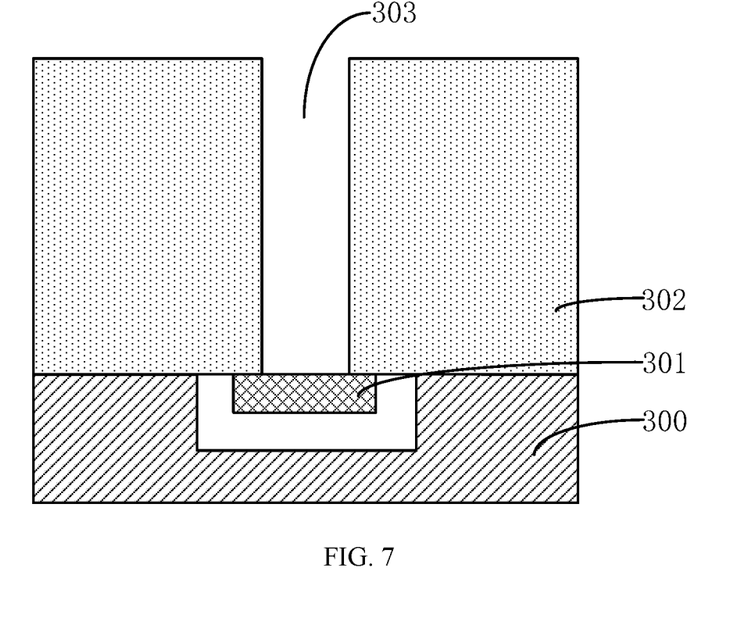
FIGS. 7-10 illustrate structures corresponding to different stages of another exemplary method for forming a semiconductor structure consistent with various embodiments of the present disclosure.
Figure 12:
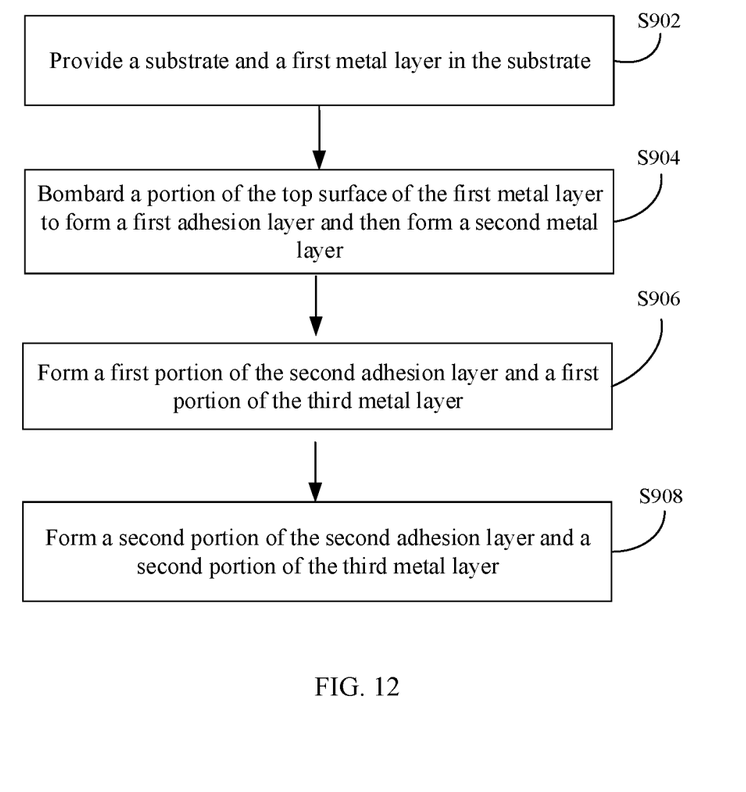
FIG. 12 illustrates another exemplary method for forming a semiconductor structure according to various disclosed embodiments of the present disclosure

As illustrated in FIG. 7, a substrate 300 and a first metal layer 301 in the substrate 300 may be provided (e.g., S902 in FIG. 12). A dielectric layer 302 may be formed on the substrate 300. The dielectric layer 302 may include a first opening 303 exposing a portion of a top surface of the first metal layer 301.

In one embodiment, the substrate 300 may include a base substrate and a device structure (not illustrated) in the base substrate. The first metal layer 301 may be deployed in the device structure.

The substrate 300, the first metal layer 301, the dielectric layer 302 and the first opening 303 may be similar with or same as a corresponding layer as illustrated in FIGS. 3-4.

Figure 8:
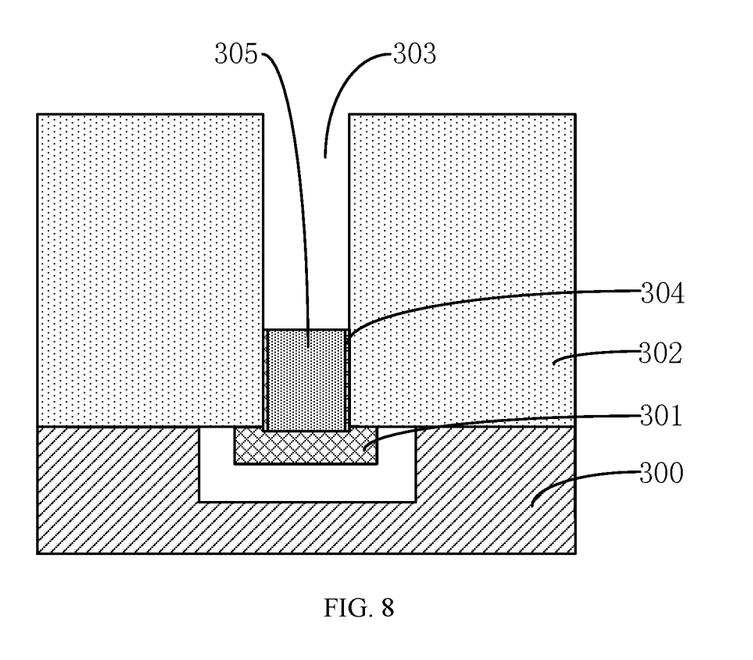

As illustrated in FIG. 8, the portion of the top surface of the first metal layer 301 may be bombarded by using a first sputtering treatment, to make the metal material on the top surface of the first metal layer 301 be sputtered to the sidewalls of the first opening 303 to form a first adhesion layer 304. Then a second metal layer 305 may be formed on a surface of the first adhesion layer 304 and the exposed portion of the top surface of the first metal layer by a first metal selective growth process (e.g., S904 in FIG. 12).

When a thickness of the first adhesion layer 304 perpendicular to the sidewalls of the first opening is too large, a required bombarding time on the first metal layer 301 by the first sputtering treatment may be too long, and the production efficiency may be reduced. When the thickness of the first adhesion layer 304 is too small, a major portion of the metal material may be embedded inside the sidewalls of the first opening 303, and only a small portion of the metal material may be located on the surfaces of the sidewalls of the first opening 303. Subsequent growth of the second metal layer 305 may be affected and the bonding between the second metal layer 305 and the sidewalls of the first opening 303 may be affected. In one embodiment, the thickness of the first adhesion layer 304 may be about 5 Å to about 8 Å, and the first sputtering treatment may use a sputtering time of about 5 s to about 10 s.

When a height of the first adhesion layer 304 parallel to the sidewalls of the first opening is too large, a required sputtering power may be too high and damage on the first metal layer 301 may be too large. When the height of the first adhesion layer 304 is too small, a number of the required subsequent sputtering growth processes may be too large, and the production efficiency may be affected. In one embodiment, the height of the first adhesion layer 304 may be about 4 nm to about 5 nm, and the first sputtering treatment may use a sputtering power of about 300 W to about 400 W.

In one embodiment, the second metal layer 305 may be made of a material including tungsten.

In one embodiment, the first metal selective growth process may use a precursor material including $WF_6$ and hydrogen gas ($H_2$).

In one embodiment, the first metal selective growth process may use process parameters including a deposition temperature of about 320° C. to about 380° C. and a deposition time of about 20 s to about 80 s.

In one embodiment, the second metal layer 305 may not fill up the first opening 303, that is, a top surface of the second metal layer 305 may be lower than a top surface of the dielectric layer 302.

In one embodiment, when the second metal layer 305 may not fill up the first opening 303, the method may further include: performing one or more sputtering growth processes, to form a conduction structure on the surface of the second metal layer 305 and the surface of the first adhesion layer 304. The conduction structure may fill up the first opening 303.

In one embodiment, A plurality of sputtering growth processes may be performed to form the conduction structure on the surface of the second metal layer 305 and the surface of the first adhesion layer 304. The conduction structure may fill up the first opening 303. In other embodiments, one sputtering process may be performed to form the conduction structure on the surface of the second metal layer 305 and the surface of the first adhesion layer 304, to fill up the first opening 303.

In one embodiment, each of the one or more sputtering growth processes may include: forming a second adhesion layer on the sidewalls of the first opening 303 by a second sputtering treatment; and forming a third metal layer in the first opening 303 by a second metal selective growth process.

Figure 9:
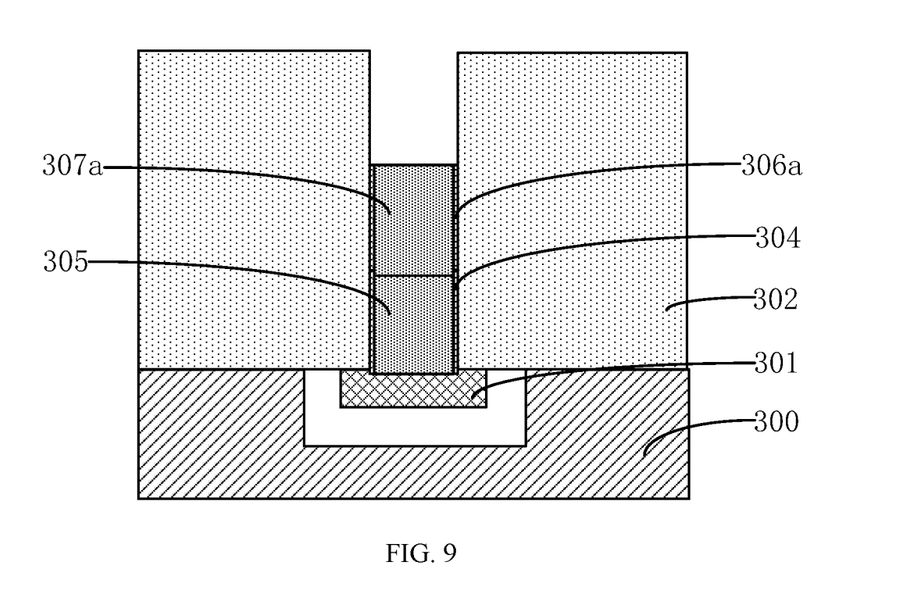
Figure 10:
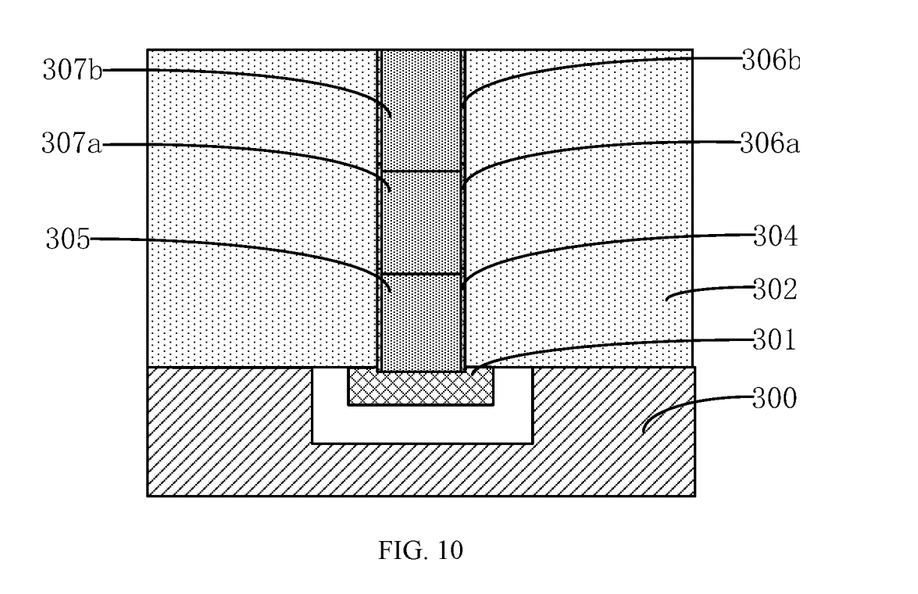

As illustrated in FIGS. 9-10, for illustration purposes, an embodiment having two sputtering growth processes may be used as an example to illustrate the present disclosure in the following. For example, the two sputtering growth processes may include two second sputtering treatments and two second metal selective growth processes.

As illustrated in FIG. 9, a first portion 306a of the second adhesion layer 306 may be formed on the sidewalls of the first opening 303 by a first one of the two second sputtering treatments, and then a first portion 307a of the third metal layer may be formed in the first opening 303 by a first one of two second metal selective growth processes (e.g., S906 in FIG. 12).

In one embodiment, the first one of the two second sputtering treatments may be used to bombard a portion of the surface of the second metal layer 305 exposed by a bottom of the first opening 303, to make the metal material on the surface of the second metal layer 305 be sputtered to the sidewalls of the first opening 303 and form the first portion 306a of the second adhesion layer 306. The first one of the two second metal selective growth processes may be used to form the first portion 307a of the third metal layer on a portion of the surface of the second metal layer 305 exposed by the bottom of the first opening 303, and on a portion of the first portion 306a of the second adhesion layer 306 exposed by the sidewalls of the first opening 303.

In one embodiment, the first one of the two second sputtering treatments may use ions including argon ions. In other embodiments, the first one of the two second sputtering treatments may use ions including helium ions.

In one embodiment, the first one of the two second metal selective growth processes may use a sputtering time of about 5 s to about 10 s and a sputtering power of about 300 W to about 400 W. The corresponding thickness of the first portion 306a of the second adhesion layer 306 may be about 5 Å to about 8 Å, and the corresponding height of the first portion 306a of the second adhesion layer 306 may be about 4 nm to about 5 nm.

In one embodiment, the first one of the two second metal selective growth processes may use a precursor material including $WF_6$ and hydrogen gas ($H_2$).

In one embodiment, the first one of the two second metal selective growth processes may use a deposition temperature of about 320° C. to about 380° C., and a deposition time of about 20 s to about 80 s.

As illustrated in FIG. 10, a second portion 306b of the second adhesion layer 306 may be formed on the sidewalls of the first opening 303 by a second one of the two second sputtering treatments, and then a second portion 307b of the third metal layer may be formed in the first opening 303 by a second one of the two second metal selective growth processes (e.g., S908 in FIG. 12).

In one embodiment, the second one of the two second sputtering treatments may be used to bombard a portion of the surface of the first portion 307b of the third metal layer exposed by a bottom of the first opening 303, to make the metal material on the surface of the first portion 307b of the third metal layer be sputtered to the sidewalls of the first opening 303 and form the second portion 306b of the second adhesion layer 306. The second one of the two second metal selective growth processes may be used to form the second portion 307b of the third metal layer on the portion of the surface of the first portion 307a of the third metal layer exposed by the bottom of the first opening 303, and on a portion of the second portion 306b of the second adhesion layer 306 exposed by the sidewalls of the first opening 303.

In one embodiment, the second one of the two second sputtering treatments may use ions including argon ions. In other embodiments, the second one of the two second sputtering treatments may use ions including helium ions.

In one embodiment, the second one of the two second metal selective growth processes may use a sputtering time of about 5 s to about 10 s and a sputtering power of about 300 W to about 400 W. The corresponding thickness of the second portion 306b of the second adhesion layer 306 may be about 5 Å to about 8 Å, and the corresponding height of the second portion 306b of the second adhesion layer 306 may be about 4 nm to about 5 nm.

In one embodiment, the first portion 307a and the second portion 307b of the third metal layer may be made of a material including tungsten.

In one embodiment, the second one of the two second metal selective growth processes may use a precursor material including $WF_6$ and hydrogen gas ($H_2$).

In one embodiment, the second one of the two second metal selective growth processes may use a deposition temperature of about 320° C. to about 380° C., and a deposition time of about 20 s to about 80 s.

In one embodiment, the conduction structure may be formed by the first portion 306a of the second adhesion layer, the first portion 307a of the third metal layer, the second portion 306b of the second adhesion layer, and the second portion 307b of the third metal layer. The conduction structure may connect the device structure in the substrate 300 with the external environment to form a circuit connection structure and realize electric functions of the semiconductor structure.

The present disclosure also provides a semiconductor structure formed by the previous method illustrated in FIG. 10.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a semiconductor structure, comprising:
providing a substrate and a first metal layer in the substrate, the first metal layer being made of tungsten;
forming a dielectric layer on the substrate, wherein the dielectric layer includes a first opening exposing a portion of a top surface of the first metal layer, forming the dielectric layer and the first opening including:
forming an initial dielectric layer on a surface of the substrate;
forming a mask structure on the initial dielectric layer;
forming a patterned layer on the mask structure, wherein the patterned layer includes an opening exposing a portion of the mask structure;
etching the exposed portion of the mask structure and the initial dielectric layer by using the patterned layer as a mask, until exposing a top surface of the device structure, to form the dielectric layer and the first opening; and
after forming the dielectric layer and the first opening, removing the patterned layer and the mask structure;
bombarding the portion of the top surface of the first metal layer exposed by the first opening using a first sputtering treatment, to sputter the tungsten of the top surface of the first metal layer onto sidewalls of the first opening to form a first adhesion layer, to cause the first adhesion layer to be made of the tungsten to avoid metal contamination;
forming a second metal layer on a surface of the first adhesion layer and on the exposed portion of the top surface of the first metal layer using a first metal selective growth process;
forming a second adhesion layer on the sidewalls of the first opening and on a surface of the first adhesion layer by using a second sputtering treatment; and
forming a third metal layer in the first opening, on a surface of the second metal layer, and on a surface of the second adhesion layer by a second metal selective growth process.

2. The method according to claim 1, wherein:
the substrate includes a base substrate and a device structure in the base substrate; and
the first metal layer is disposed in the device structure.

3. The method according to claim 2, wherein:
the base substrate is made of a material including silicon, germanium, SiGe, SiC, GaAs, InGa, or a combination thereof.

4. The method according to claim 1, wherein:
the first metal layer is made of a material including tungsten, cobalt, ruthenium, or a combination thereof.

5. The method according to claim 1, wherein:
the second metal layer is made of a material including tungsten.

6. The method according to claim 1, wherein the initial dielectric layer is made of a material including SiO2, a low-k dielectric material, an ultra-low-k dielectric material, or a combination thereof.

7. The method according to claim 1, wherein:
the first sputtering treatment uses ions including argon ions, helium ions, or a combination thereof.

8. The method according to claim 1, wherein:
the first sputtering treatment uses process parameters including a sputtering time of about 5 seconds to about 10 seconds and a sputtering power of about 300 W to about 400 W.

9. The method according to claim 1, wherein:
the second metal layer fills up the first opening.

10. The method according to claim 1, wherein:
a top surface of the second metal layer is lower than a top surface of the dielectric layer; and
the method further includes performing a plurality of sputtering growth processes to form the second adhesion layer and the third metal layer on the surface of the second metal layer and on the surface of the first adhesion layer, wherein the second adhesion layer and the third metal layer fill up the first opening.

11. The method according to claim 10, wherein:
each of the plurality of sputtering growth processes includes: forming a corresponding portion of the second adhesion layer on the sidewalls of the first opening by using the second sputtering treatment; and forming a corresponding portion of the third metal layer in the first opening by the second metal selective growth process.

12. The method according to claim 11, wherein:
the second sputtering treatment is used to bombard a portion of the surface of the second metal layer exposed by the first opening, to make the metal material on the surface of the second metal layer be sputtered onto the sidewalls of the first opening and form the corresponding portion of the second adhesion layer; or
the second sputtering treatment is used to bombard a portion of a surface of the third metal layer exposed by the first opening, to make the metal material on the surface of the third metal layer be sputtered to the sidewalls of the first opening and form the corresponding portion of the second adhesion layer.

13. The method according to claim 12, wherein:
the second metal selective growth process is used to form the corresponding portion of the third metal layer on a portion of the surface of the second metal layer exposed the first opening, and on a portion of a surface of the second adhesion layer exposed by the sidewalls of the first opening; or
the second metal selective growth process is used to form the corresponding portion of the third metal layer on a portion of a surface of a formed portion of the third metal layer exposed by the first opening, and on a portion of the second adhesion layer exposed by the sidewalls of the first opening.

14. The method according to claim 11, wherein:
the second sputtering treatment uses ions including argon ions, helium ions, or a combination thereof.

15. The method according to claim 11, wherein:
the second sputtering treatment uses process parameters including a sputtering time of about 5 seconds to about 10 seconds and a sputtering power of about 300 W to about 400 W.

16. The method according to claim 11, wherein:
the third metal layer is made of a material including tungsten.

17. A method for forming a semiconductor structure, comprising:
providing a substrate and a first metal layer in the substrate, the first metal layer being made of tungsten;
forming a dielectric layer on the substrate, wherein the dielectric layer includes a first opening exposing a portion of a top surface of the first metal layer, forming the dielectric layer and the first opening including:
forming an initial dielectric layer on a surface of the substrate;
forming a mask structure on the initial dielectric layer;
forming a patterned layer on the mask structure, wherein the patterned layer includes an opening exposing a portion of the mask structure;
etching the exposed portion of the mask structure and the initial dielectric layer by using the patterned layer as a mask, until exposing a top surface of the device structure, to form the dielectric layer and the first opening; and
after forming the dielectric layer and the first opening, removing the patterned layer and the mask structure;
bombarding the portion of the top surface of the first metal layer exposed by the first opening using a first sputtering treatment, to sputter the tungsten of the top surface of the first metal layer onto sidewalls of the first opening to form a first adhesion layer, to cause the first adhesion layer to be made of the tungsten to avoid metal contamination;
forming a second metal layer on a surface of the first adhesion layer and on the exposed portion of the top surface of the first metal layer using a first metal selective growth process, a top surface of the second metal layer being lower than a top surface of the dielectric layer; and
performing one or more sputtering growth processes to form a conduction structure on a surface of the second metal layer and on a surface of the first adhesion layer;
wherein:
the conduction structure fills up the first opening; and
each of the one or more sputtering growth processes includes:
forming a corresponding portion of a second adhesion layer on the sidewalls of the first opening by using a second sputtering treatment; and
forming a corresponding portion of a third metal layer in the first opening by a second metal selective growth process.

* * * * *